United States Patent
Maki et al.

(10) Patent No.: US 11,193,978 B2
(45) Date of Patent: Dec. 7, 2021

(54) POWER CONVERSION DEVICE, ROTATING MACHINE SYSTEM USING SAME, AND DIAGNOSIS METHOD FOR SAME

(71) Applicant: Hitachi Industrial Equipment Systems Co., Ltd., Tokyo (JP)

(72) Inventors: Kohji Maki, Tokyo (JP); Yoshitaka Iwaji, Tokyo (JP); Tetsuji Kato, Tokyo (JP)

(73) Assignee: HITACHI INDUSTRIAL EQUIPMENT SYSTEMS CO., LTD., Tokyo (JP)

(*) Notice: Subject to any disclaimer, the term of this patent is extended or adjusted under 35 U.S.C. 154(b) by 0 days.

(21) Appl. No.: 16/771,738

(22) PCT Filed: Nov. 22, 2018

(86) PCT No.: PCT/JP2018/043174
§ 371 (c)(1),
(2) Date: Jun. 11, 2020

(87) PCT Pub. No.: WO2019/146232
PCT Pub. Date: Aug. 1, 2019

(65) Prior Publication Data
US 2021/0072319 A1    Mar. 11, 2021

(30) Foreign Application Priority Data

Jan. 26, 2018 (JP) .............................. JP2018-011131

(51) Int. Cl.
*G01R 31/34* (2020.01)
*G01R 19/165* (2006.01)
(Continued)

(52) U.S. Cl.
CPC ..... *G01R 31/343* (2013.01); *G01R 19/16538* (2013.01); *G01R 31/1227* (2013.01);
(Continued)

(58) Field of Classification Search
CPC ............ G01R 31/343; G01R 19/16538; G01R 31/1227; G01R 31/346; G01R 31/34; H02P 27/08; H02P 29/024
(Continued)

(56) References Cited

U.S. PATENT DOCUMENTS

| 2014/0035493 A1* | 2/2014 | Ajima | ...................... H02P 21/18 |
| | | | 318/400.04 |
| 2014/0103937 A1* | 4/2014 | Khan | ....................... H02S 50/10 |
| | | | 324/509 |

(Continued)

FOREIGN PATENT DOCUMENTS

| JP | 2001-141795 A | 5/2001 |
| JP | 2017-062170 A | 3/2017 |
| JP | 2019-20278 A | 2/2019 |

OTHER PUBLICATIONS

International Search Report of PCT/JP2018/043174 dated Jan. 29, 2019.

*Primary Examiner* — Farhana A Hoque
(74) *Attorney, Agent, or Firm* — Mattingly & Malur, PC

(57) ABSTRACT

A power conversion device according to the present invention is connected to a rotating machine comprising an armature coil and supplies and receives power. The power conversion device has a function for: collectively applying voltage pulses to the armature coil or coils for one or more specific phases of the rotating machine, sampling the current values of the specific phases from the start of the rising or falling of the voltage pulses until a designated delay time, detecting variation in the capacitance of an insulation member of the armature coils of the specific phases of the rotating machine from variation from a normal state of the current values, and diagnosing insulation degradation.

12 Claims, 17 Drawing Sheets

(51) Int. Cl.
  *G01R 31/12*    (2020.01)
  *H02P 27/08*    (2006.01)
  *H02P 29/024*   (2016.01)

(52) U.S. Cl.
  CPC ............ *G01R 31/346* (2013.01); *H02P 27/08* (2013.01); *H02P 29/024* (2013.01)

(58) Field of Classification Search
  USPC .................................................... 324/765.01
  See application file for complete search history.

(56) References Cited

U.S. PATENT DOCUMENTS

| | | |
|---|---|---|
| 2014/0176152 A1 | 6/2014 | Wolbank |
| 2017/0089983 A1 | 3/2017 | Kato et al. |

\* cited by examiner (a)

(b)

POWER CONVERSION DEVICE, ROTATING MACHINE SYSTEM USING SAME, AND DIAGNOSIS METHOD FOR SAME

TECHNICAL FIELD

The present invention relates to a power conversion device that is connected to a rotating machine such as a motor or a generator to transmit and receive a power, a rotating machine system using the same, and a diagnosis method for the same.

BACKGROUND ART

When a rotating machine such as a motor or a generator stops due to a sudden failure, serious damage occurs. In particular, a sudden stoppage of a motor used in a factory facility due to the sudden failure has a large effect such as a reduction in an operation rate of a production facility and a review of a production plan. Thus, there is an increasing need to prevent the sudden failure of the motor by performing a failure sign diagnosis with high accuracy while being used in an actual environment.

To meet such needs, for example, PTL 1 discloses a technique in which a step-shaped voltage is applied to a motor from a power conversion device, a peak value and a frequency of ringing are extracted by sampling a current at a high speed, and degradation of coil insulation is detected. However, in this technique, since the sampling is performed at such a high speed at which a ringing waveform can be directly measured, there is a problem that a measurement device becomes expensive.

PTL 2 discloses a technique in which a pulse is transmitted from any phase of an upper arm of a power conversion device when a compressor stops, and an insulation resistance is obtained by measuring a DC unit voltage and a motor current. However, this technique has a problem that an abnormality cannot be detected until the insulation resistance actually decreases and it is difficult to catch a sign of insulation failure at a sufficiently early stage.

CITATION LIST

Patent Literature

PTL 1: US 2014/0176152 A1
PTL 2: JP 2001-141795 A

SUMMARY OF INVENTION

Technical Problem

The present invention has been made in order to solve the above-described problems of the related arts, and an object of the present invention is to early detect a sign of insulation failure of a rotating machine at low cost.

Solution to Problem

A power conversion device according to the present invention is a power conversion device that is connected to a rotating machine including an armature coil to transmit and receive a power. The device has a function of collectively applying voltage pulses to the armature coil having a single specific phase or a plurality of specific phases in the rotating machine, sampling a value of a current of the specific phase after a designated delay time from the start of rising or falling of the voltage pulse, detecting a change in a capacitance of an insulation member of the armature coil having the specific phase in the rotating machine by a change in the value from a normal state, and diagnosing insulation degradation.

In the power conversion device according to the present invention, the value of the current is sampled once whenever the voltage pulse rises or falls once or multiple times. The sampling of the value of the current includes sampling in which a delay time from the start of the rising or falling of the voltage pulse is different.

In the power conversion device according to the present invention, after the value of the current is sampled, a peak value of ringing is extracted, and the extracted peak value is used for the diagnosis. Alternatively, after the value of the current is sampled, a timing at which the value exceeds a preset threshold value is extracted, and the extracted timing is used for the diagnosis. Alternatively, the value of the current is sampled in a state in which the rotating machine is normal, a timing at which a sign of the value is inverted is extracted, the value of the current at the extracted timing is sampled, and the sampled value is used for the diagnosis.

The power conversion device according to the present invention includes a user interface for instructing that the diagnosis starts. The power conversion device according to the present invention includes an interface that displays or communicates a diagnosis result to the outside.

In the power conversion device according to the present invention, a time required for the rising or falling of the voltage pulse is set to be longer than a period during which a current of the specific phase vibrates.

A rotating machine system according to the present invention includes the power conversion device having the aforementioned features, and the rotating machine that is connected to the power conversion device to transmit and receive a power.

In a diagnosis method of a rotating machine system according to the present invention, the rotating machine system includes the power conversion device having the aforementioned features, and the rotating machine that is connected to the power conversion device to transmit and receive a power. The diagnosis method includes performing a diagnosis in a time zone in which the rotating machine stops. Alternatively, the diagnosis method includes performing a diagnosis in a time zone in which the rotating machine is rotating.

In a diagnosis method of a rotating machine system according to the present invention, the rotating machine system includes a rotating machine including an armature coil. The method includes collectively applying voltage pulses to the armature coil having a single specific phase or a plurality of specific phases in the rotating machine, sampling a value of a current of the specific phase after a designated delay time from the start of rising or falling of the voltage pulse, detecting a change in a capacitance of an insulation member of the armature coil having the specific phase in the rotating machine by a change in the value from a normal state, and diagnosing insulation degradation.

Advantageous Effects of Invention

As described above, according to the power conversion device according to the present invention and the rotating machine system using the same, since high-speed sampling is not required, a microcomputer and a current sensor mounted on the power conversion device can perform the diagnosis. Since the capacitance of the insulation member is measured instead of the insulation resistance, degradation of an insulation material can be detected with high sensitivity. As described above, it is possible to realize the power conversion device having the function of early detecting the sign of insulation failure of the rotating machine at low cost, and the rotating machine system using the same.

DESCRIPTION OF EMBODIMENTS

Hereinafter, embodiments of the present invention will be described with reference to the drawings.

First Embodiment

Figure 1:
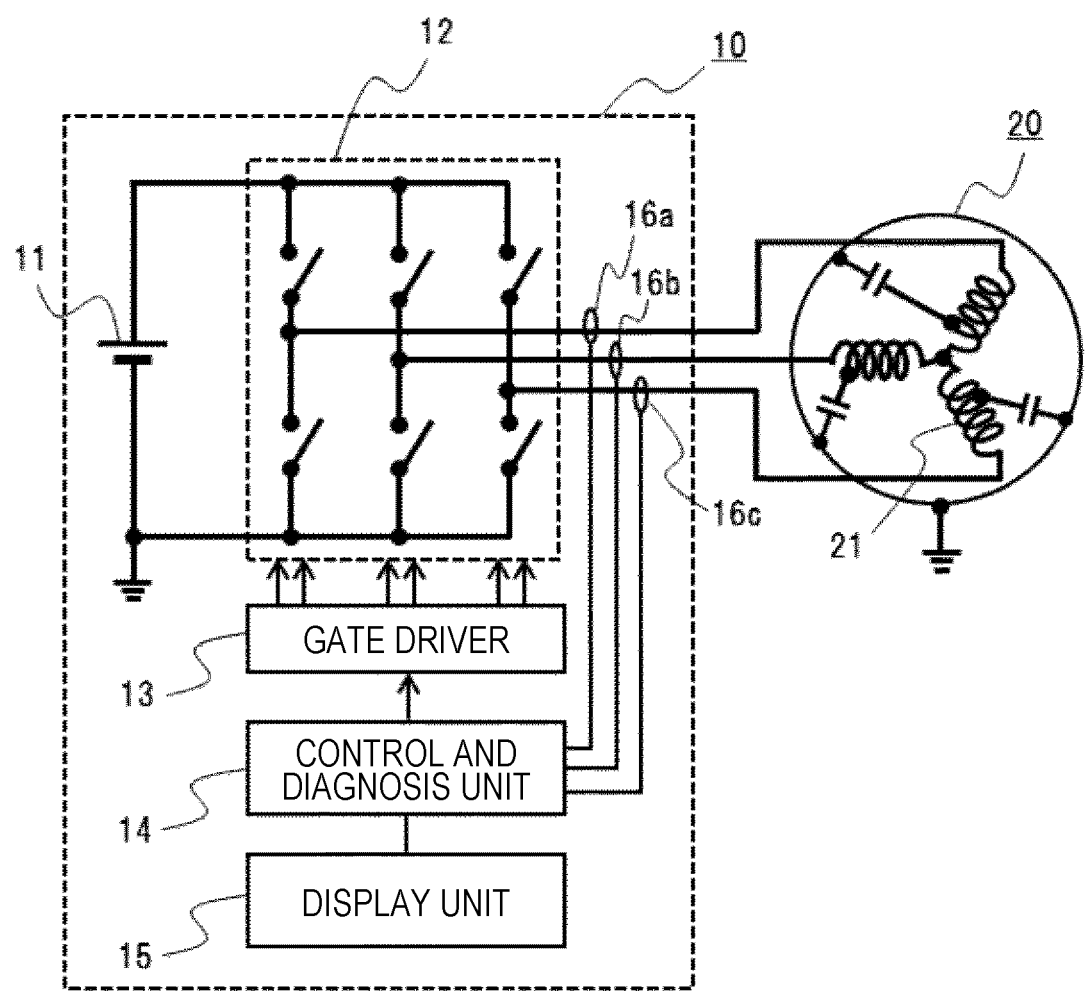
FIG. 1 is a basic configuration diagram of a first embodiment of a power conversion device according to the present invention and a rotating machine system using the same.

FIG. 1 is a basic configuration diagram of a first embodiment of a power conversion device according to the present invention and a rotating machine system using the same. The rotating machine system includes a power conversion device 10 that includes a DC power supply 11, a main circuit 12, a gate driver 13, a control and diagnosis unit 14, a display unit 15, and current sensors 16a, 16b, and 16c, and a rotating machine 20 that is connected to the power conversion device to transmit and receive a power. Although it has been described in FIG. 1 that armature coils 21 of the rotating machine are in a Y connection, a Δ connection may be used. Although it has been described that a three-phase motor using three power supply lines, the number of phases may be different.

When an insulation member of the armature coil of the rotating machine is degraded, a capacitance changes before an insulation resistance decreases. In the present invention, the change in the capacitance is detected, and thus, the insulation degradation is detected at an early stage. Accordingly, the detected insulation degradation is regarded as a failure sign.

Figure 2:
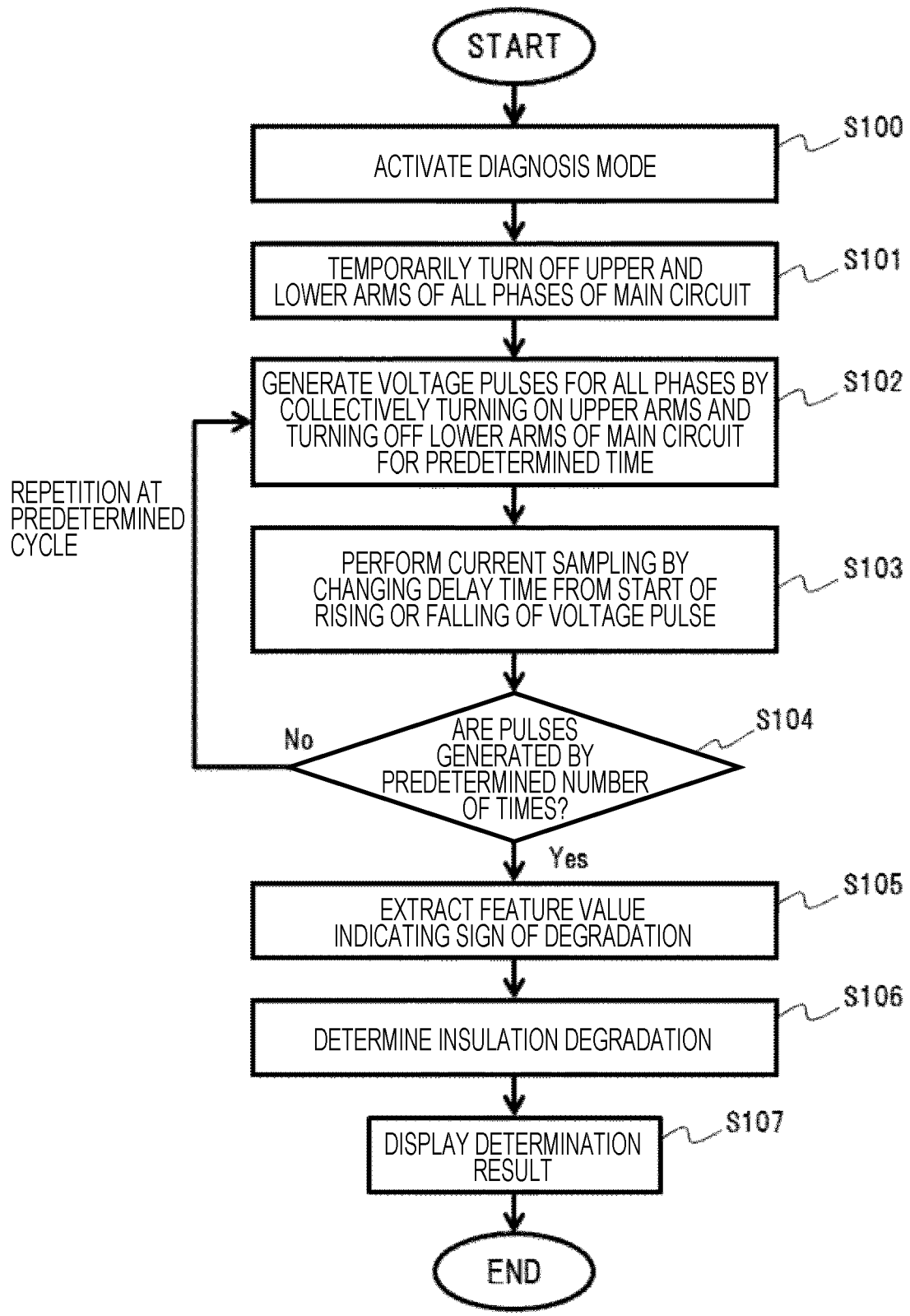
FIG. 2 is a flowchart for diagnosing insulation degradation of the rotating machine provided in the power conversion device according to the first embodiment of the present invention.

FIG. 2 is a flowchart of diagnosing the insulation degradation of the rotating machine provided in the power conversion device according to the present embodiment. First, in step S100, a diagnosis mode is activated. In addition to a method of selecting the diagnosis mode from setting items of the power conversion device, the diagnosis mode may be selected by pressing a mechanical button for activating the diagnosis mode, or touching a "diagnosis mode" button displayed on a display. Alternatively, the diagnosis mode may be set to start automatically at a specific date and time, or may be set to start automatically before or after a specific rotating machine control operation. In particular, for a period during which the rotating machine is stopping, for example, immediately before the rotating machine starts or immediately after the rotating machine stops, since noise in a current measurement is also small, such a timing is suitable for diagnosis. When there is no period during which the rotating machine stops, the rotating machine may be rotating.

Figure 3:
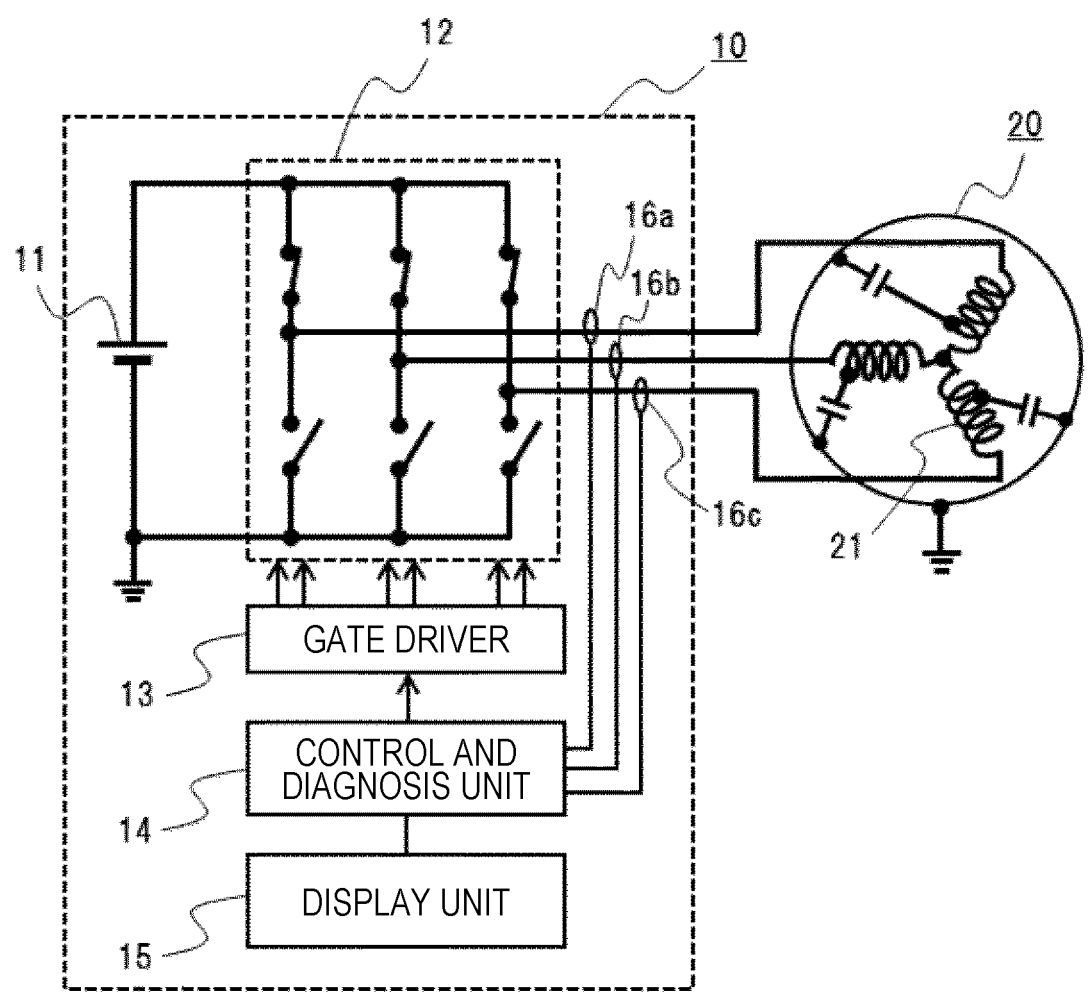
FIG. 3 is a schematic diagram illustrating a voltage pulse generation method according to the first embodiment of the present invention.

Subsequently, in step S101, upper and lower arms of all phases of the main circuit are temporarily turned OFF. Subsequently, in step S102, voltage pulses are applied to all the phases of the rotating machine while collectively turning ON only the upper arms and turning OFF the lower arms of the main circuit for a predetermined time. A state thereof is illustrated in FIG. 3. Here, a side with a higher earth voltage is called the upper arm, and a side with a lower earth voltage is called the lower arm. When the lower arm has a non-zero earth voltage, only the lower arm may be turned ON while the upper arm is turned OFF.

Figure 4:
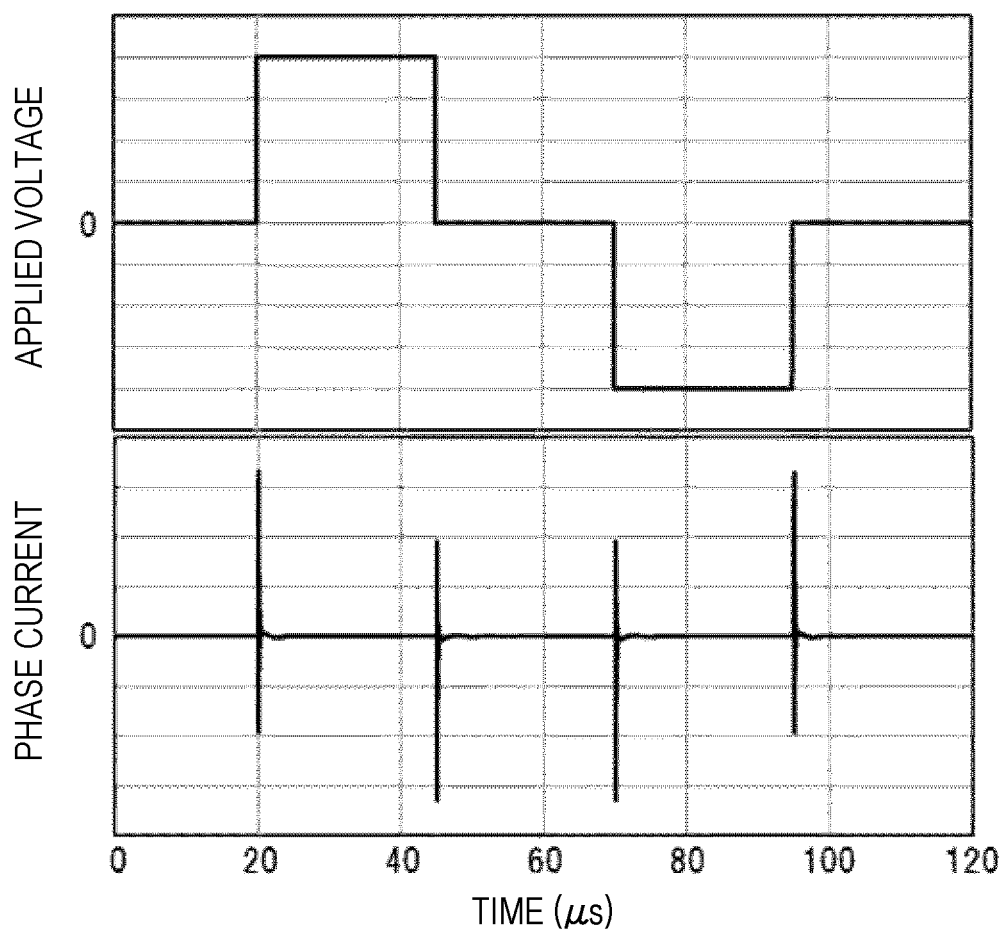
FIG. 4 illustrates a typical voltage pulse waveform (when a rising time or a falling time is short) and a typical current waveform measured at this time in the first embodiment of the present invention.

FIG. 4 illustrates a typical voltage pulse waveform when a rising time or a falling time is short and a typical current waveform measured by a one-phase current sensor at this time. FIG. 5(a) is an enlarged view of the current waveform at a rising timing of a voltage pulse, and FIG. 5(b) is an enlarged view of the current waveform at a falling timing of the voltage pulse.

Figure 5:
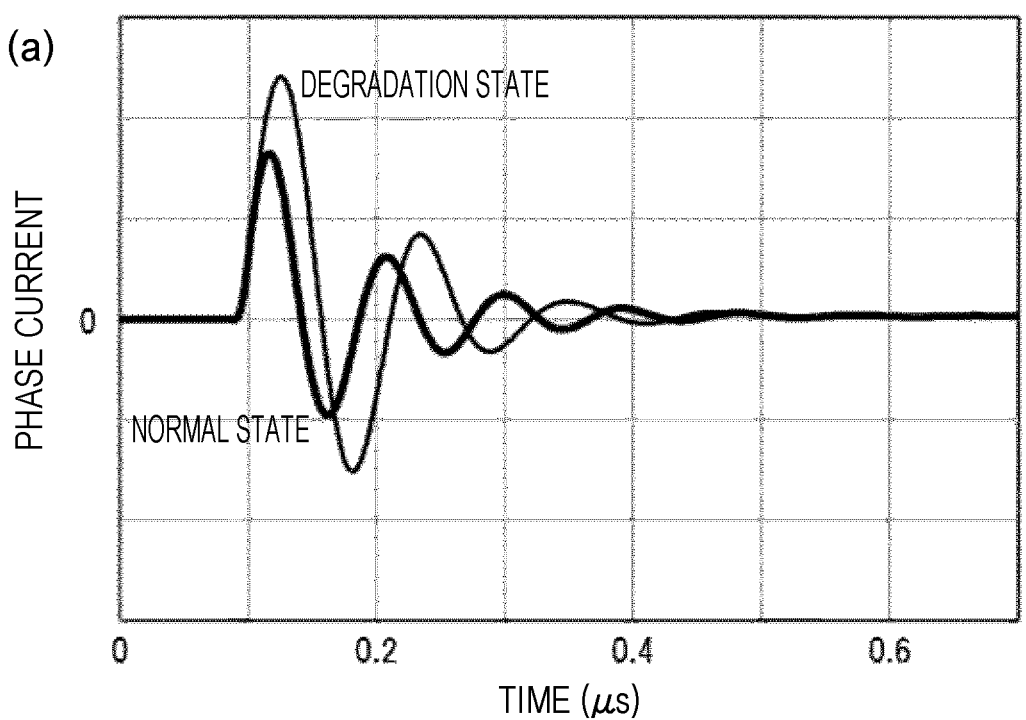
FIG. 5 is an enlarged view of a typical current waveform measured in the first embodiment of the present invention (when the rising time or falling time of the voltage pulse is short).
Figure 5:
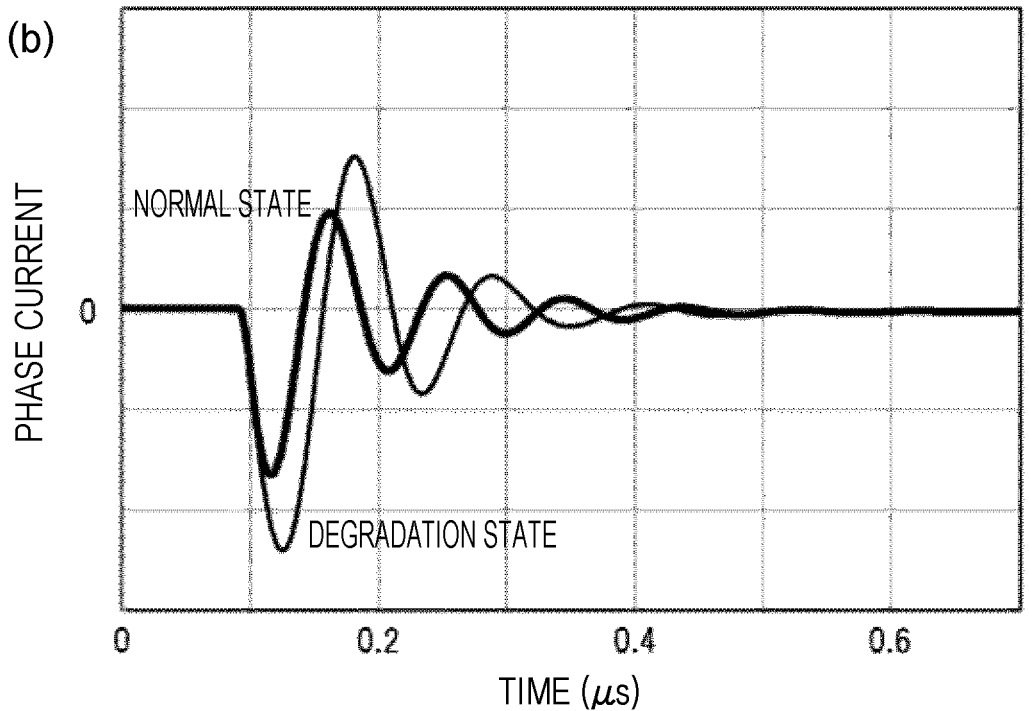
Figure 6:
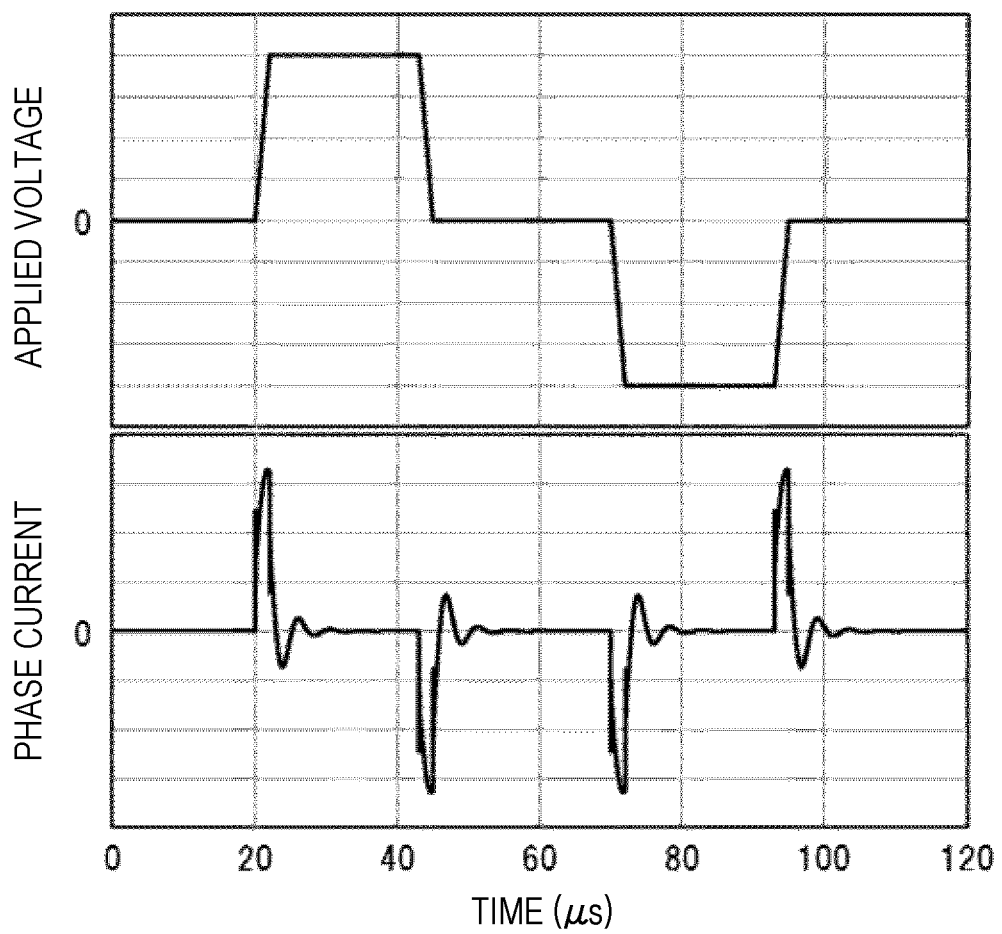
FIG. 6 illustrates a typical voltage pulse waveform (when the rising time or the falling time is long) and a typical current waveform measured at this time in the first embodiment of the present invention.
Figure 7:
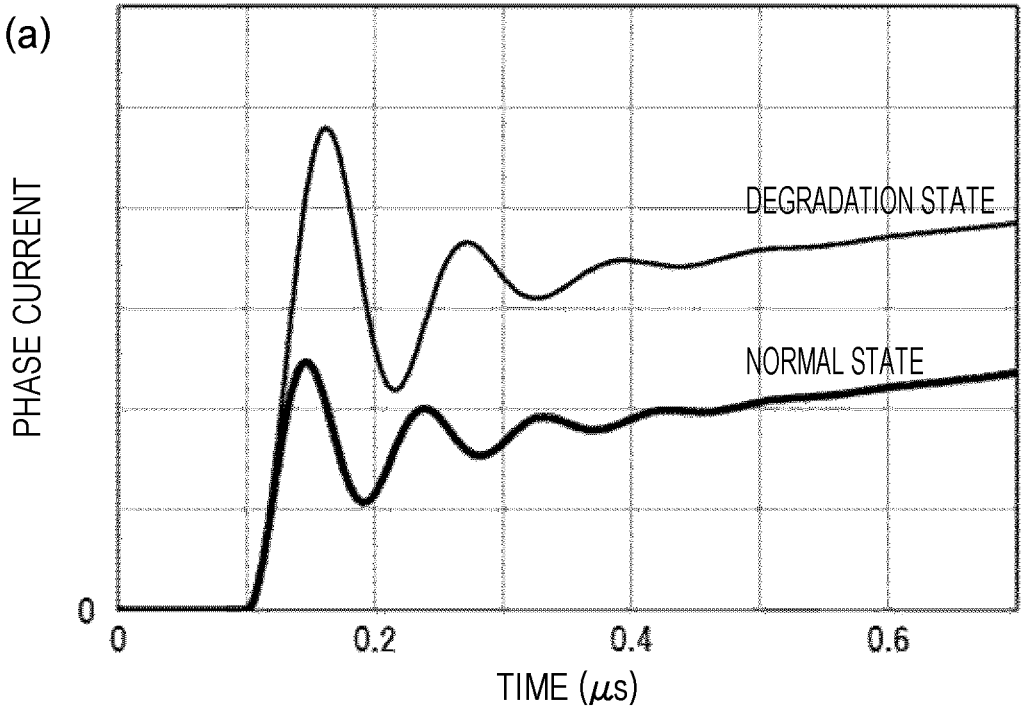
FIG. 7 is an enlarged view of a typical current waveform measured in the first embodiment of the present invention (when the rising time or falling time of the voltage pulse is long).
Figure 7:
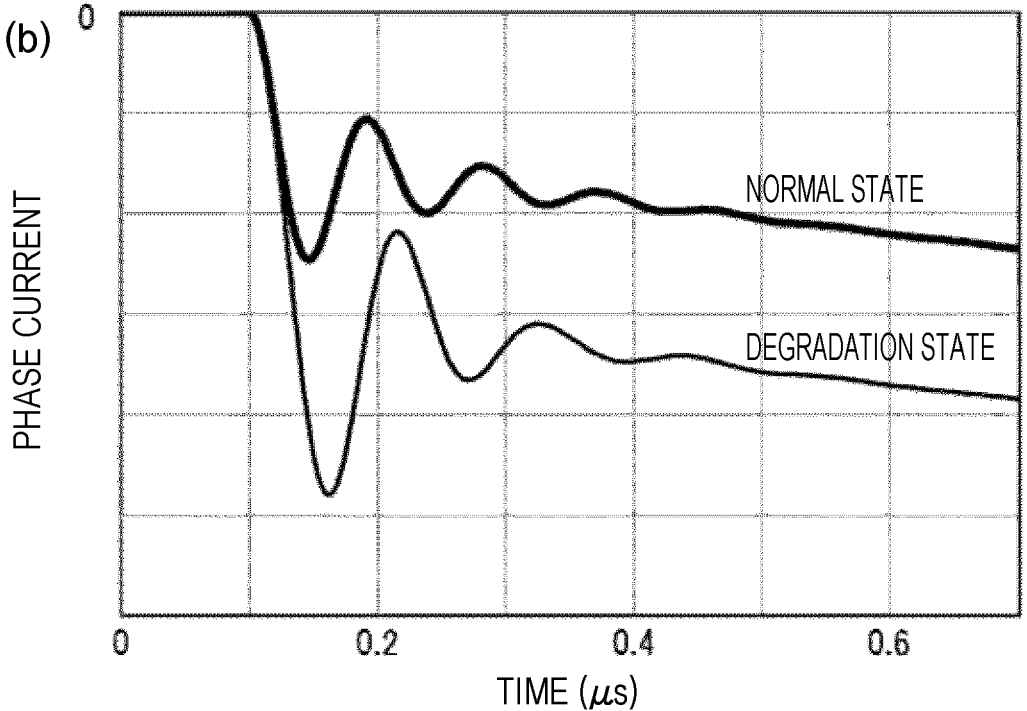

Meanwhile, FIG. 6 illustrates a typical voltage pulse waveform when the rising time or the falling time is long and a typical current waveform measured by a one-phase current sensor at this time. FIG. 7(a) is an enlarged view of the current waveform at a rising timing of the voltage pulse, and FIG. 7(b) is an enlarged view of the current waveform at a fall timing of the voltage pulse. In FIGS. 5 and 7, a case of a normal state (thick line) and a case (thin line) where the insulation member of the armature coil of the rotating machine is degraded and an earth capacitance of the armature coil of the phase for which the current is measured increases double are overlapped and illustrated. It can be seen that ringing of the current occurs at a rising and a falling of the voltage pulse and a peak value and a frequency thereof are different between the normal state and a degradation state. As illustrated in FIG. 5, when the rising time or the falling time of the voltage pulse is short, the ringing continues even after the voltage becomes constant, and the difference between the normal state and the degradation state appears only in a ringing waveform. Accordingly, it is necessary to catch the entire ringing waveform to some extent by sampling a plurality of points in order to catch a sign of degradation in such a case.

Meanwhile, as illustrated in FIG. 7, when the rising time or the falling time of the voltage pulse is long, since the voltage continues to increase or decrease even after the ringing is converged, the current also continues to increase or decrease. Thus, it is sufficient to sample a current value after the ringing is converged at one point in order to catch the sign of degradation in such a case. However, as a method of ascertain how long the ringing continues, it is effective to catch the entire ringing waveform by sampling the plurality of points.

A ringing frequency is typically about 10 MHz, and high-speed sampling of 100 MHz or more is required in the prior art in order to early catch the sign of degradation by accurately measuring the peak value and the frequency thereof. Thus, a control microcomputer normally provided in the power conversion device cannot follow the speed of the sampling, and it is necessary to additionally install an expensive measuring device.

Figure 8:
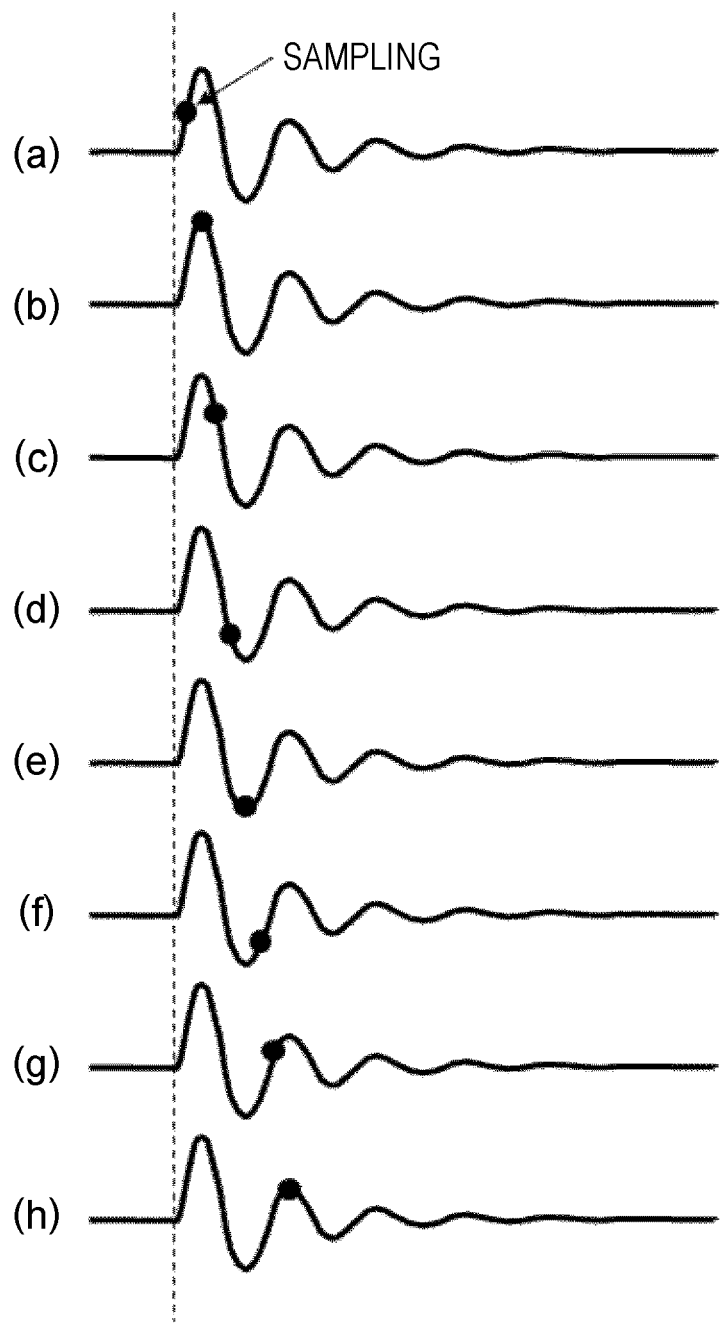
FIG. 8 illustrates a current sampling method according to the first embodiment of the present invention.
Figure 9:
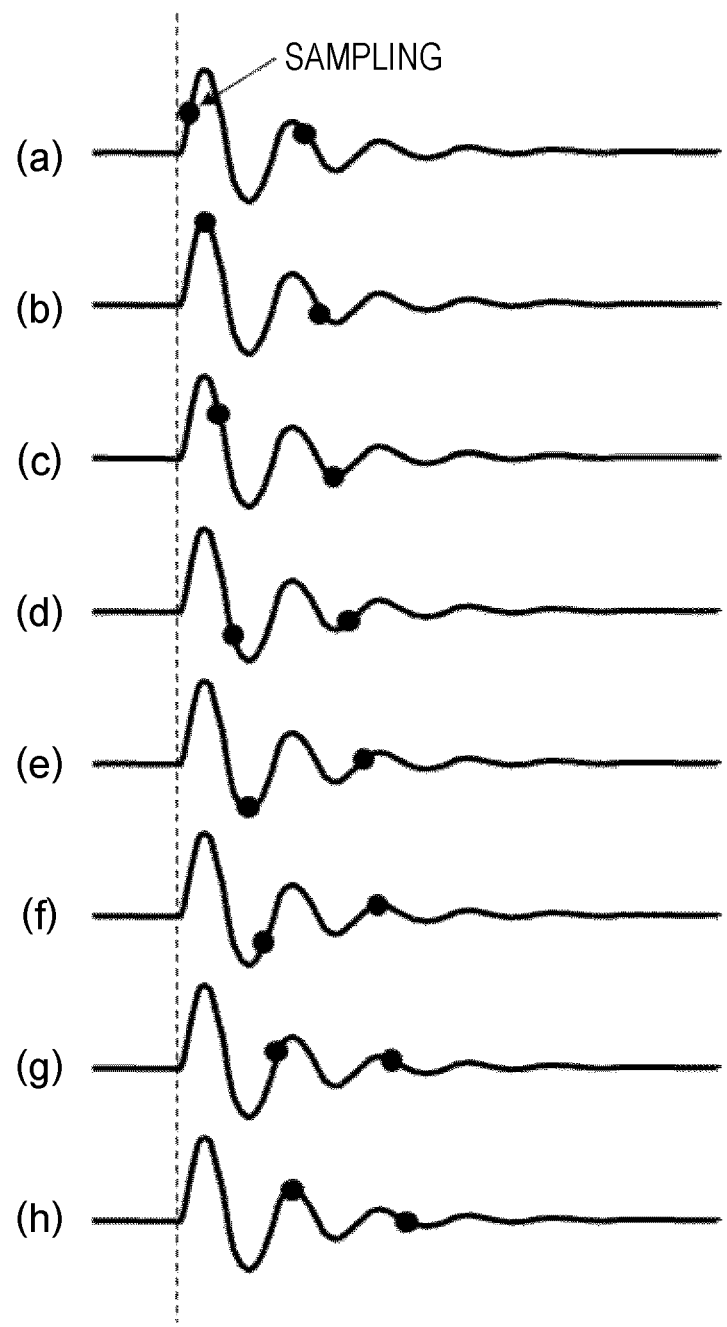
FIG. 9 illustrates a current sampling method according to the first embodiment of the present invention.

Accordingly, in the present invention, the current sampling is performed at a lower speed while adjusting such that a delay time from the start of the rising or falling of the voltage pulse is different from each other (step S103). For example, the sampling may be performed once for one rising or falling of the voltage pulse as illustrated in FIG. 8, or the sampling may be performed multiple times for one rising or falling thereof as illustrated in FIG. 9. The generation of the voltage pulse and the current sampling are repeated at a predetermined cycle until the number of repetitions reaches a predetermined number of times (step S104), and thus, the entire ringing waveform is reconstructed. There may be a rising edge or a falling edge for which the current sampling is not performed between (a) to (h) of FIGS. 8 and 9. The sampling may not be performed for (a) to (h) of FIGS. 8 and 9 in this order, and the order thereof may be appropriately replaced. Although FIGS. 8 and 9 illustrate the current waveforms at the rising of the voltage pulse, the same applies to the current waveform at the falling.

Subsequently, in step S105, a feature value indicating the sign of degradation is extracted. For example, a peak value of the ringing may be extracted, or a timing at which the current value exceeds a predetermined threshold value may be extracted. A timing at which a sign of the current value is inverted may be extracted.

In step S106, it is determined whether or not the extracted feature value exceeds a preset threshold value. Alternatively, as a result of determining whether or not a degree of abnormality when the feature value is analyzed by an algorithm of machine learning such as vector quantization clustering exceeds a preset upper limit, when the degree of abnormality exceeds the preset upper limit, it is diagnosed that there is the sign of degradation.

Finally, in step S107, a diagnosis result is displayed, and the diagnosis is completed. The display method may be a display, a lamp, or a buzzer that appeals to the human senses, or the diagnosis result may be recorded on paper or an electronic file. Alternatively, the diagnosis result may be transmitted via a communication network.

As described above, according to the present invention, it is possible to realize a power conversion device having a function of early detecting a sign of insulation failure of a rotating machine at low cost, and a rotating machine system using the same.

Second Embodiment

Figure 10:
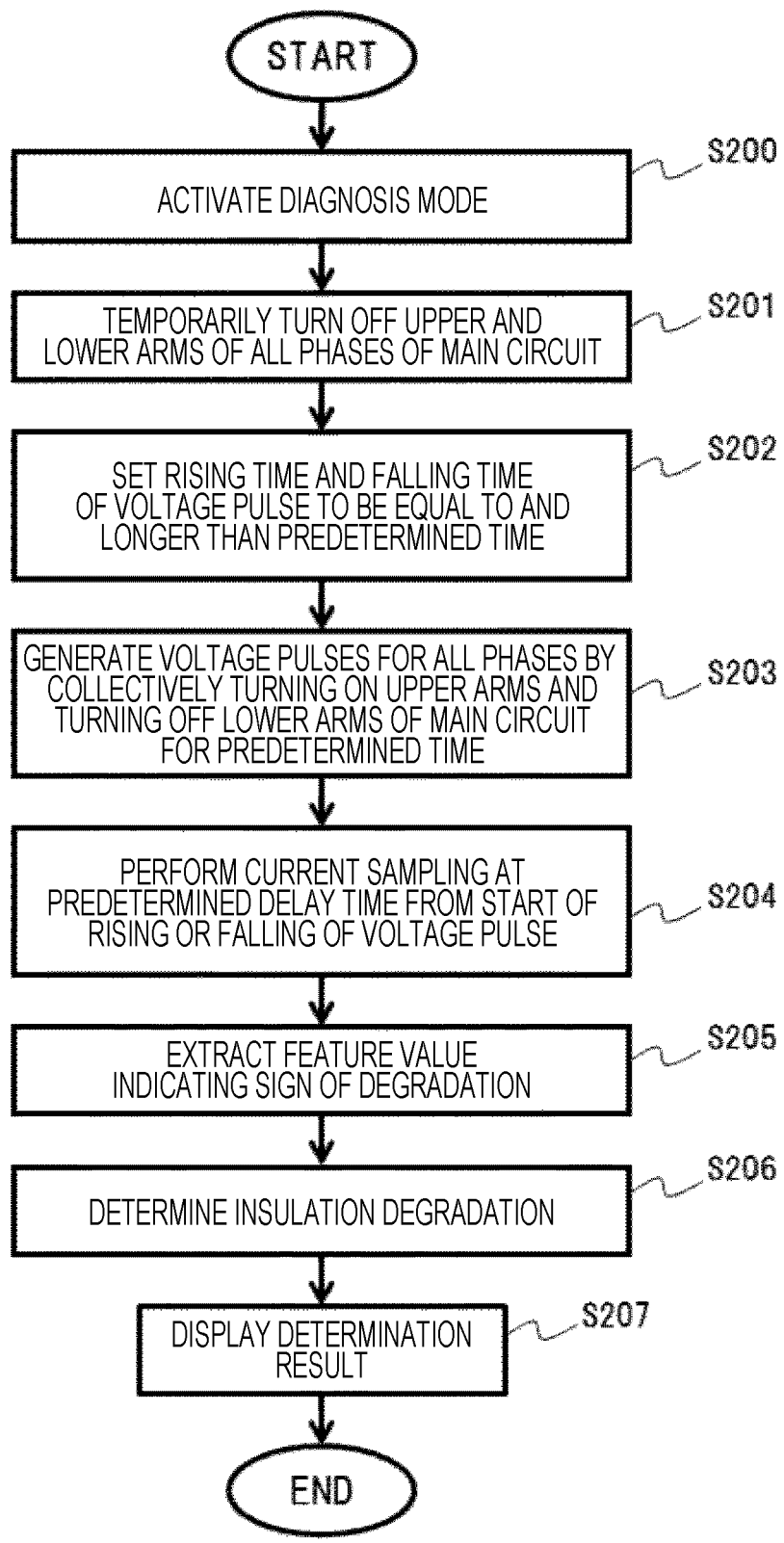
FIG. 10 is a flowchart for diagnosing insulation degradation of a rotating machine provided in a power conversion device according to a second embodiment of the present invention.

FIG. 10 is a diagnosis flowchart according to a second embodiment of the present invention. Differences from the first embodiment is that when the voltage pulse is generated, the rising time or the falling time is set to be longer than a period during which the ringing of the current continues (step S202). Thus, it is necessary to ascertain how long the ringing of the current continues in advance, but it is assumed here that the ringing of the current is separately ascertained. By doing this, as illustrated in FIG. 7 of the first embodiment, a difference is also generated between the normal state and the degradation state in a current value of a flat portion after the ringing is converged. Thus, it is possible to sufficiently catch the sign of degradation by merely sampling one point in a time zone in which the current value is flat. Accordingly, in the present embodiment, the voltage pulse is generated once (step S203). The current sampling may be performed only once (step S204). However, the generation of the voltage pulse and the current sampling are prevented from being performed multiple times in order to reduce a measurement error. As described above, the sign of insulation failure of the rotating machine can be detected with a smaller amount of measured data.

Third Embodiment

Figure 11:
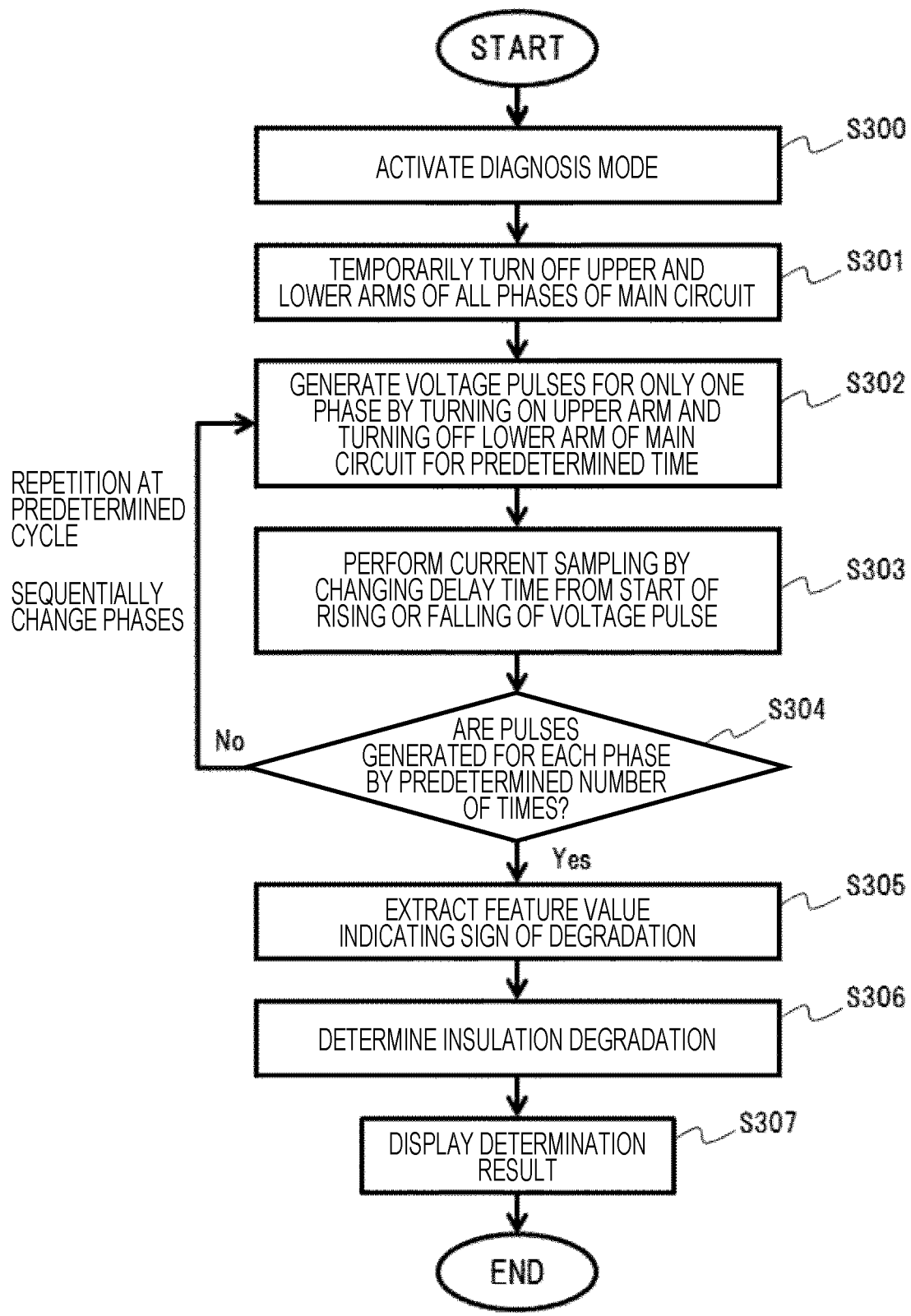
FIG. 11 is a flowchart for diagnosing insulation degradation of a rotating machine provided in a power conversion device according to a third embodiment of the present invention.
Figure 12:
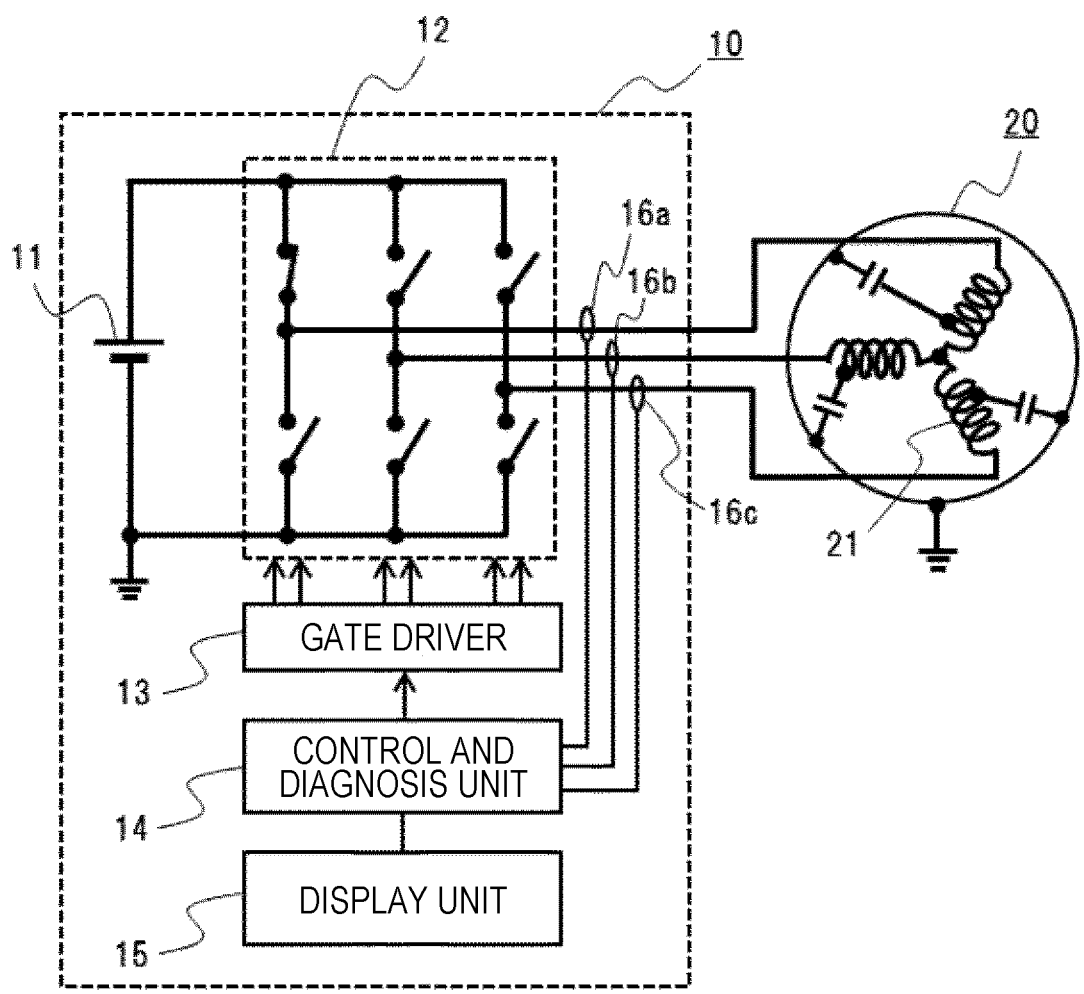
FIG. 12 is a schematic diagram 1 illustrating a voltage pulse generation method according to the third embodiment of the present invention.
Figure 13:
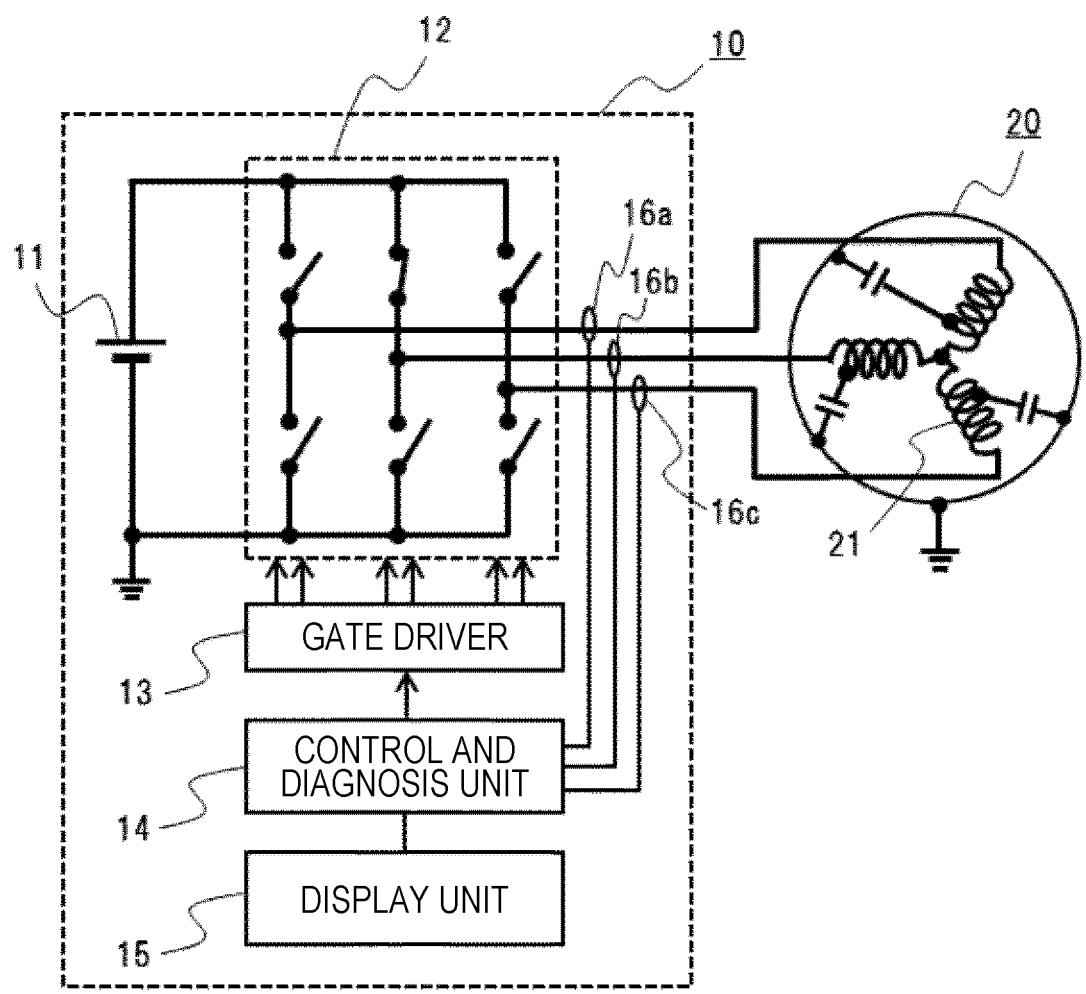
FIG. 13 is a second schematic diagram 2 illustrating the voltage pulse generation method according to the third embodiment of the present invention.
Figure 14:
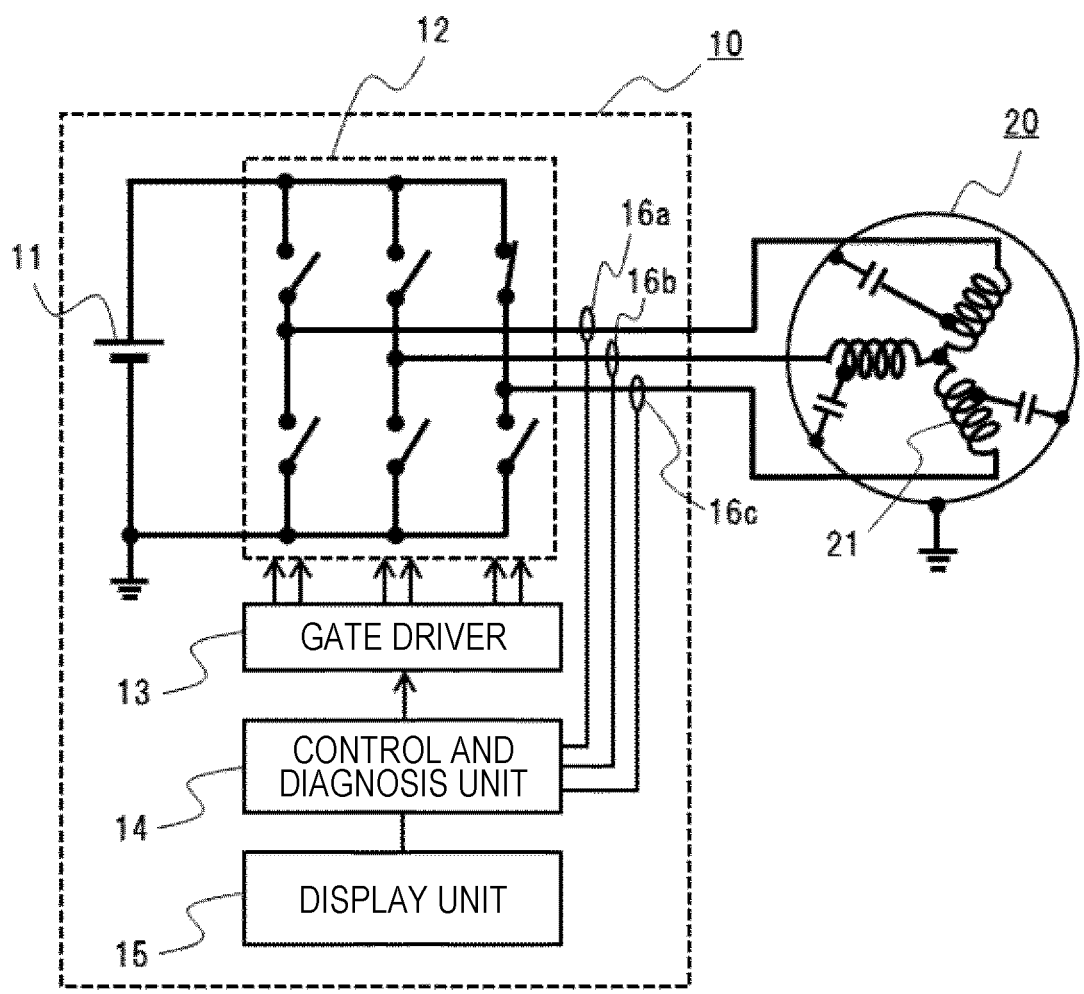
FIG. 14 is a schematic diagram 3 illustrating the voltage pulse generation method according to the third embodiment of the present invention.

FIG. 11 is a diagnosis flowchart according to a third embodiment of the present invention. Differences from the first and second embodiments are that the voltage pulse is applied to not all the phases collectively but the phases one by one as illustrated in FIGS. 12 to 14. After the voltage pulse is generated a predetermined number of times in one phase, one phase may shift to another phase, or the voltage pulse may be generated while changing the phases like U phase→V phase→W phase→U phase→V phase→W phase→U phase→ . . . for each time. Alternatively, the entire ringing waveform may be reconstructed by sampling the plurality of points as in the first embodiment, or when the rising time or falling time of the voltage pulse is longer than a time during which the ringing continues, only one point may be sampled as in the second embodiment. As described above, since the sum of the current values flowing collectively becomes small compared to a case where the voltage pulses are collectively applied to all the phases, a possibility of malfunction due to electromagnetic noise can be reduced.

Fourth Embodiment

Figure 15:
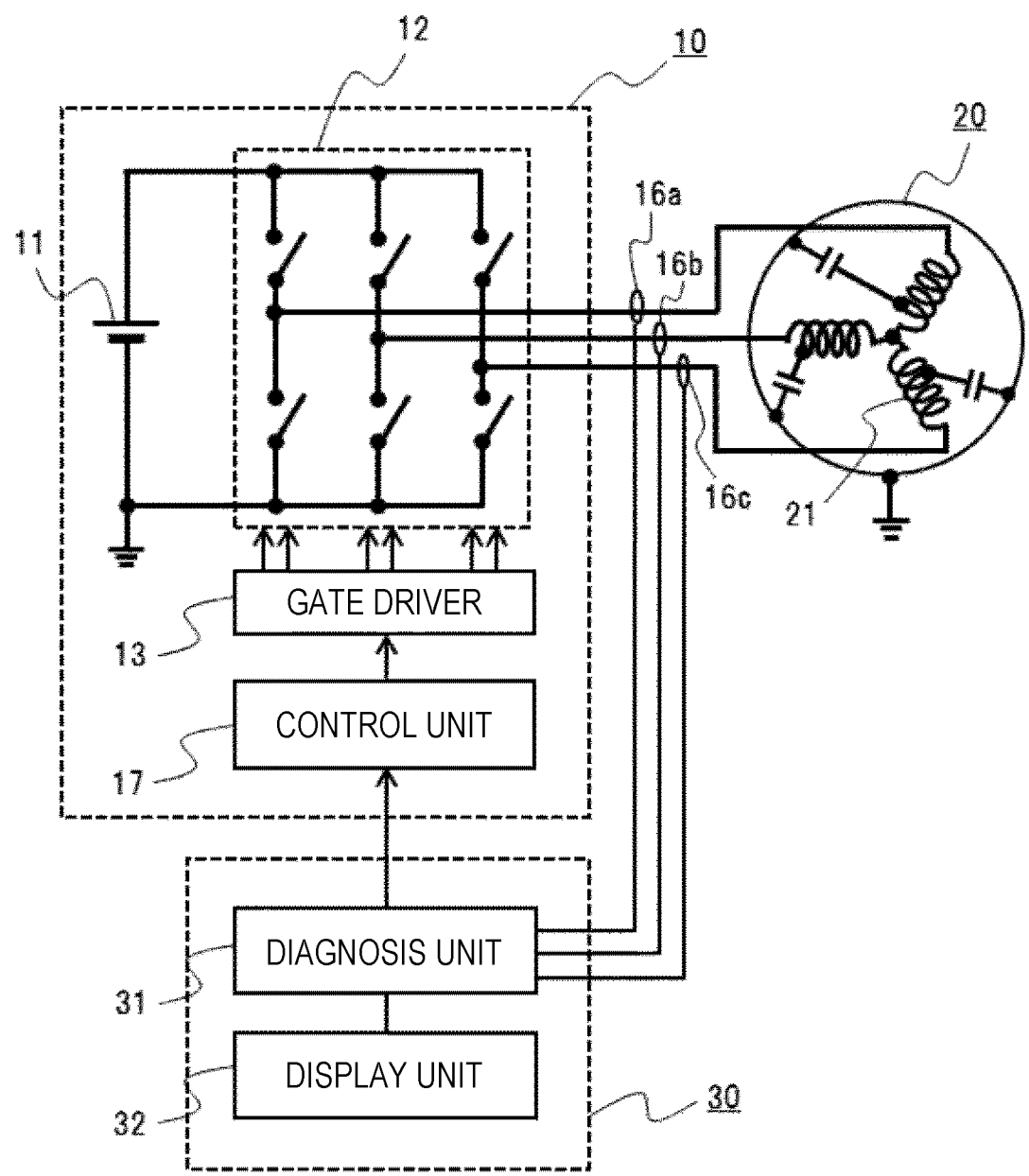
FIG. 15 is a basic configuration diagram of a fourth embodiment of the power conversion device according to the present invention and the rotating machine system using the same.

FIG. 15 is a basic configuration diagram of a fourth embodiment of the power conversion device according to the present invention, and the rotating machine system using the same. Differences from the first to third embodiments are that a diagnosis device 30 is externally provided separately from the power conversion device connected to the rotating machine. It is possible to extract the feature value indicating the sign of degradation without being influenced by the performance of the control microcomputer by adopting such a configuration. In FIG. 15, a diagnosis unit 31 is connected to a control unit 17 of the power conversion device, and thus, a desired voltage pulse is generated by using the power conversion device. However, a pulse generation power source may be separately prepared, and the voltage pulse may be generated by controlling the pulse generation power source.

Fifth Embodiment

Figure 16:
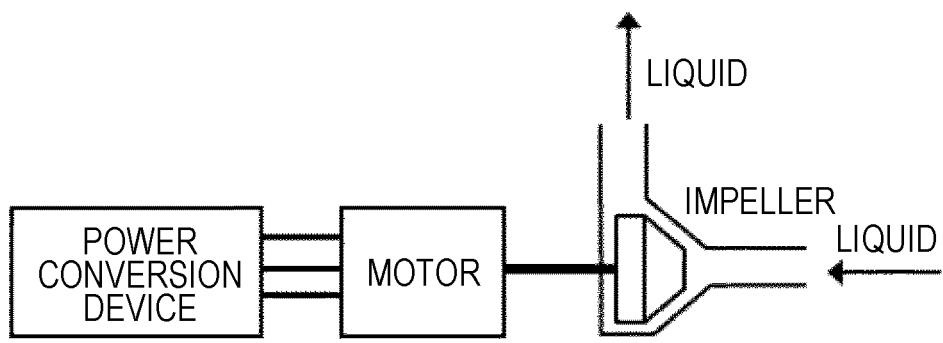
FIG. 16 is a schematic diagram of a pump incorporating the power conversion device according to the present invention and the rotating machine system using the same.

FIG. 16 is a schematic diagram of a pump incorporating the power conversion device according to the present invention and the rotating machine system using the same. An impeller is provided in a motor connected to the power conversion device, and sucks and sends a liquid such as water. As long as the pump does not operate continuously, since there is a time zone in which the pump stops, the diagnosis is performed in this time zone. When the continuous operation is performed, the diagnosis is performed in a time zone during which a load is relatively light.

Sixth Embodiment

Figure 17:
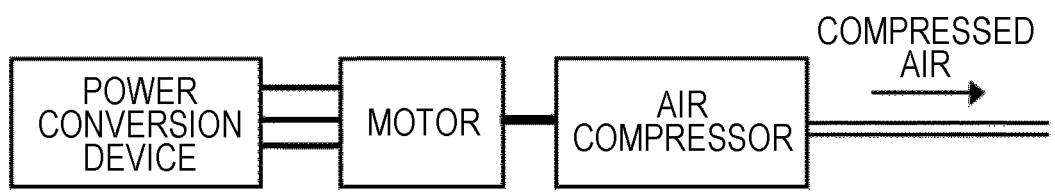
FIG. 17 is a schematic diagram of an air compressor incorporating the power conversion device according to the present invention and the rotating machine system using the same.

FIG. 17 is a schematic diagram of an air compressor incorporating the power conversion device according to the present invention and the rotating machine system using the same. In the air compressor, since there is a time zone in which the driving of the motor stops when an operation having no load is performed, the diagnosis is performed in this time zone.

Seventh Embodiment

Figure 18:
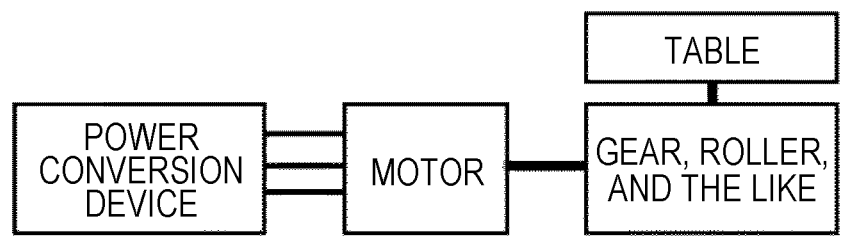
FIG. 18 is a schematic diagram of a conveyance table incorporating the power conversion device according to the present invention and the rotating machine system using the same.

FIG. 18 is a schematic diagram of a conveyance table incorporating the power conversion device according to the present invention and the rotating machine system using the same. In the conveyance table, since there is usually a time zone in which the motor stops between a conveyance process of a workpiece and a conveyance process, the diagnosis is performed at this timing.

While the embodiments have been described, the present invention is not limited to the aforementioned embodiments, and includes various modification examples. For example, the aforementioned embodiments are described in detail in order to facilitate easy understanding of the present invention, and are not limited to necessarily include all the described components. Some of the components of a certain embodiment can be substituted into the components of another embodiment, and the components of another embodiment can be added to the component of a certain embodiment. Additions, the components of another embodiment can be added, removed, and substituted to, from, and into some of the components of the aforementioned embodiments.

REFERENCE SIGNS LIST 10 power conversion device
11 DC power supply
12 main circuit
13 gate driver
14 control and diagnosis unit
15 display unit
16 current sensor
17 control unit
20 rotating machine
21 armature coil
30 diagnosis device
31 diagnosis unit
32 display unit

The invention claimed is:

1. A power conversion device that is connected to a rotating machine including an armature coil to transmit and receive a power, the device having a function of collectively applying voltage pulses to the armature coil having a single specific phase or a plurality of specific phases in the rotating machine, sampling a value of a current of the specific phase after a designated delay time from the start of rising or falling of the voltage pulse, detecting a change in a capacitance of an insulation member of the armature coil having the specific phase in the rotating machine by a change in the value from a normal state, and diagnosing insulation degradation,
  wherein the value of the current is sampled in a state in which the rotating machine is normal, a timing at which a sign of the value is inverted is extracted, the value of the current at the extracted timing is sampled, and the sampled value is used for the diagnosis.

2. The power conversion device according to claim 1, wherein the value of the current is sampled once whenever the voltage pulse rises or falls once or multiple times.

3. The power conversion device according to claim 1, wherein the sampling of the value of the current includes sampling in which a delay time from the start of the rising or falling of the voltage pulse is different.

4. The power conversion device according to claim 1, wherein, after the value of the current is sampled, a peak value of ringing is extracted, and the extracted peak value is used for the diagnosis.

5. The power conversion device according to claim 1, wherein, after the value of the current is sampled, a timing at which the value exceeds a preset threshold value is extracted, and the extracted timing is used for the diagnosis.

6. The power conversion device according to claim 1, further comprising:
  a user interface for instructing that the diagnosis starts.

7. The power conversion device according to claim 1, further comprising:
  an interface that displays or communicates a diagnosis result to the outside.

8. The power conversion device according to claim 1, wherein a time required for the rising or falling of the voltage pulse is set to be longer than a period during which a current of the specific phase vibrates.

9. A rotating machine system comprising:
  the power conversion device according to claim 1; and
  the rotating machine that is connected to the power conversion device to transmit and receive a power.

10. A diagnosis method of a rotating machine system, wherein the rotating machine system includes
the power conversion device according to claim 1, and
the rotating machine that is connected to the power conversion device to transmit and receive a power, and
the diagnosis method includes performing a diagnosis in a time zone in which the rotating machine stops.

11. A diagnosis method of a rotating machine system, wherein the rotating machine system includes
the power conversion device according to claim 1, and
the rotating machine that is connected to the power conversion device to transmit and receive a power, and
the diagnosis method includes performing a diagnosis in a time zone in which the rotating machine is rotating.

12. A diagnosis method of a rotating machine system including a rotating machine including an armature coil, the method comprising:

collectively applying voltage pulses to the armature coil having a single specific phase or a plurality of specific phases in the rotating machine;

sampling a value of a current of the specific phase after a designated delay time from the start of rising or falling of the voltage pulse;

detecting a change in a capacitance of an insulation member of the armature coil having the specific phase in the rotating machine by a change in the value from a normal state; and diagnosing insulation degradation, wherein the value of the current is sampled in a state in which the rotating machine is normal, a timing at which a sign of the value is inverted is extracted, the value of the current at the extracted timing is sampled, and the sampled value is used for the diagnosis.

* * * * *